US012792548B2

(12) United States Patent
Kim et al.

(10) Patent No.: US 12,792,548 B2
(45) Date of Patent: Nov. 10, 2026

(54) MEMORY DEVICE PERFORMING IN-MEMORY COMPUTING BASED ON CAPACITOR COUPLING

(71) Applicant: SEOUL NATIONAL UNIVERSITY R&DB FOUNDATION, Seoul (KR)

(72) Inventors: Jae-Joon Kim, Seoul (KR); Eunhwan Kim, Pohang-si (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 44 days.

(21) Appl. No.: 18/976,477

(22) Filed: Dec. 11, 2024

(65) Prior Publication Data

US 2025/0209026 A1 Jun. 26, 2025

(30) Foreign Application Priority Data

Dec. 20, 2023 (KR) ........................ 10-2023-0186980
Apr. 19, 2024 (KR) ........................ 10-2024-0052564

(51) Int. Cl.
*G06F 13/40* (2006.01)
*G11C 7/16* (2006.01)
*G11C 11/412* (2006.01)

(52) U.S. Cl.
CPC ............ *G06F 13/4022* (2013.01); *G11C 7/16* (2013.01); *G11C 11/412* (2013.01)

(58) Field of Classification Search
CPC ...... G06F 13/4022; G11C 7/16; G11C 11/412
USPC .......................................................... 710/316
See application file for complete search history.

(56) References Cited

U.S. PATENT DOCUMENTS

| | | | | |
|---|---|---|---|---|
| 5,325,325 | A * | 6/1994 | Azuma | G11C 7/20 365/174 |
| 11,176,991 | B1 * | 11/2021 | Shaik | G06F 7/5443 |
| 2019/0042199 | A1 * | 2/2019 | Sumbul | G11C 11/4094 |
| 2019/0370640 | A1 * | 12/2019 | Peng | G11C 11/413 |
| 2020/0233923 | A1 * | 7/2020 | Knag | G11C 8/08 |
| 2021/0158854 | A1 * | 5/2021 | Sinangil | G11C 11/412 |
| 2022/0236869 | A1 * | 7/2022 | Chih | G06F 3/061 |
| 2022/0276835 | A1 * | 9/2022 | Yang | G06N 3/0495 |
| 2022/0351761 | A1 * | 11/2022 | Yang | H03M 1/462 |
| 2023/0078079 | A1 * | 3/2023 | Atallah | G06N 3/065 706/22 |

FOREIGN PATENT DOCUMENTS

| | | |
|---|---|---|
| KR | 10-2022-0118924 A | 8/2022 |
| KR | 10-2023-0059127 A | 5/2023 |
| KR | 10-2023-0078218 A | 6/2023 |

OTHER PUBLICATIONS

Kim, Eunhwan, et al., "A Capacitive Computing-in-Memory Circuit with Low Input Loading SRAM Bitcell and Adjustable ADC Input Range.", IEEE Transactions on Circuits and Systems II: Express Briefs, 2023, 70.9: 3268-3272.

* cited by examiner

*Primary Examiner* — Titus Wong
(74) *Attorney, Agent, or Firm* — Bridgeway IP Law Group, PLLC; Jihun Kim

(57) ABSTRACT

Proposed is a memory device including a plurality of memory cells performing in-memory computing. Each of the plurality of memory cells includes a storage unit storing data, and an operation circuit that includes a capacitor and controls a voltage charged to the capacitor according to input data and storage data stored in the storage unit.

7 Claims, 11 Drawing Sheets

200

| input data (IN) | storage data | output node ($\overline{Q}$) | capacitor node (Qc) |
|---|---|---|---|
| 0(GND) | 0(GND) | 1($V_{DD}$) | 1($V_{DD}$) |
| 0(GND) | 1($V_{DD}$) | 0(GND) | 1($V_{DD}$) |
| 1($V_{DD}$) | 0(GND) | 1($V_{DD}$) | 1($V_{DD}$) |
| 1($V_{DD}$) | 1($V_{DD}$) | 0(GND) | 0(GND) |

FIG. 5

| input data (IN) | storage data | output node (Q) | capacitor node (Qc) |
|---|---|---|---|
| 0(GND) | 0(GND) | 0(GND) | 0(GND) |
| 0(GND) | 1($V_{DD}$) | 1($V_{DD}$) | 0(GND) |
| 1($V_{DD}$) | 0(GND) | 0(GND) | 0(GND) |
| 1($V_{DD}$) | 1($V_{DD}$) | 1($V_{DD}$) | 1($V_{DD}$) |

FIG. 8

MEMORY DEVICE PERFORMING IN-MEMORY COMPUTING BASED ON CAPACITOR COUPLING

CROSS-REFERENCE TO RELATED APPLICATION

This application claims the benefit under 35 USC 119(a) of Korean Patent Application Nos. 10-2024-0052564 filed on Apr. 19, 2024 and 10-2023-0186980 filed on Dec. 20, 2023 in the Korean Intellectual Property Office, the entire disclosures of which are incorporated herein by reference for all purposes.

BACKGROUND

1. Field

The present disclosure relates to a memory device that performs in-memory computing.

2. Description of the Related Art

Computing in memory (CIM) is also called in-memory computing (IMC) or processing in memory (PIM), and is technology for enabling a memory device to perform computational functions in addition to data storage functions, and has been widely studied recently as a technology for implementing artificial intelligence (AI) semiconductors.

FIGS. 1A and 1B illustrate configurations of memory cells that perform general in-memory computing.

As illustrated in FIGS. 1A and 1B, each memory cell includes a 6T-structured static random access memory (SRAM) cell. In addition, when charging and discharging a capacitor, a value stored in the SRAM is stored in the capacitor, and because a signal is received through a source and a drain during charging and discharging, there is a problem in that a lot of energy is consumed due to a driver or digital-to-analog converter (DAC) existing for each column and the entire area also increases.

A memory cell illustrated in FIG. 1A includes 6T SRAM and uses an 8T1C structure that includes a total of 8 transistors and 1 capacitor. Because a signal is transmitted to a capacitor only through NMOS transistors, the memory cell is sensitive to element fluctuation and may damage an input signal.

In addition, the memory cell illustrated in FIG. 1B includes 6T SRAM and uses a 10T1C structure that includes a total of 10 transistors and 1 capacitor. Unlike the 8T1C structure, the 10T1C structure includes PMOS transistors in addition to the NMOS transistors for signal transmission, and accordingly, sensitivity on the element fluctuation may be reduced, but there is disadvantage of using two more transistors, and a circuit connection diagram is complicated, resulting in an increase in area, that is more than twice the area of the 6T SRAM.

The present disclosure proposes a memory cell having a new structure that may reduce energy consumption and an area of a memory cell for in-memory computing.

A prior patent document related to this includes Korean Patent Publication No. 10-2023-0078218 (Title of invention: Memory device having local computing cell based on computing-in-memory).

SUMMARY

The present disclosure provides a memory device including a plurality of memory cells that perform in-memory computing based on capacitor coupling.

However, technical objects to be achieved by the present embodiments are not limited to the technical objects described above, and there may be other technical objects.

According to an aspect of the present disclosure, a memory device includes a plurality of memory cells performing in-memory computing. In addition, each of the plurality of memory cells includes a storage unit storing data, and an operation circuit that includes a capacitor and controls a voltage charged to the capacitor according to input data and storage data stored in the storage unit.

According to the present disclosure, an area of the memory device that performs in-memory computing may be reduced, and also, energy consumption of the memory device may be reduced.

BRIEF DESCRIPTION OF THE DRAWINGS

FIG. 5 illustrates a truth table showing an operation of a memory cell according to the present disclosure.

FIG. 8 illustrates a truth table showing an operation of a memory cell according to the present disclosure.

DETAILED DESCRIPTION

Figure 1A:
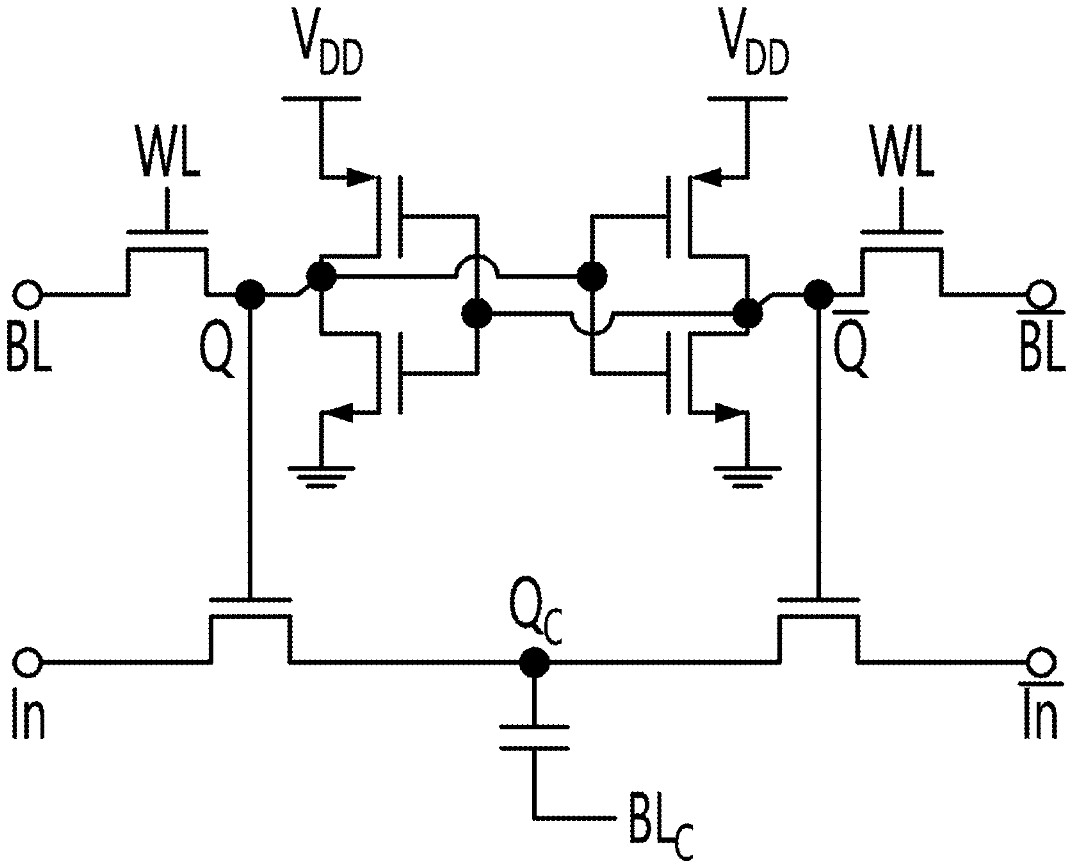
FIGS. 1A and 1B illustrate configurations of memory cells performing general in-memory computing.
Figure 1B:
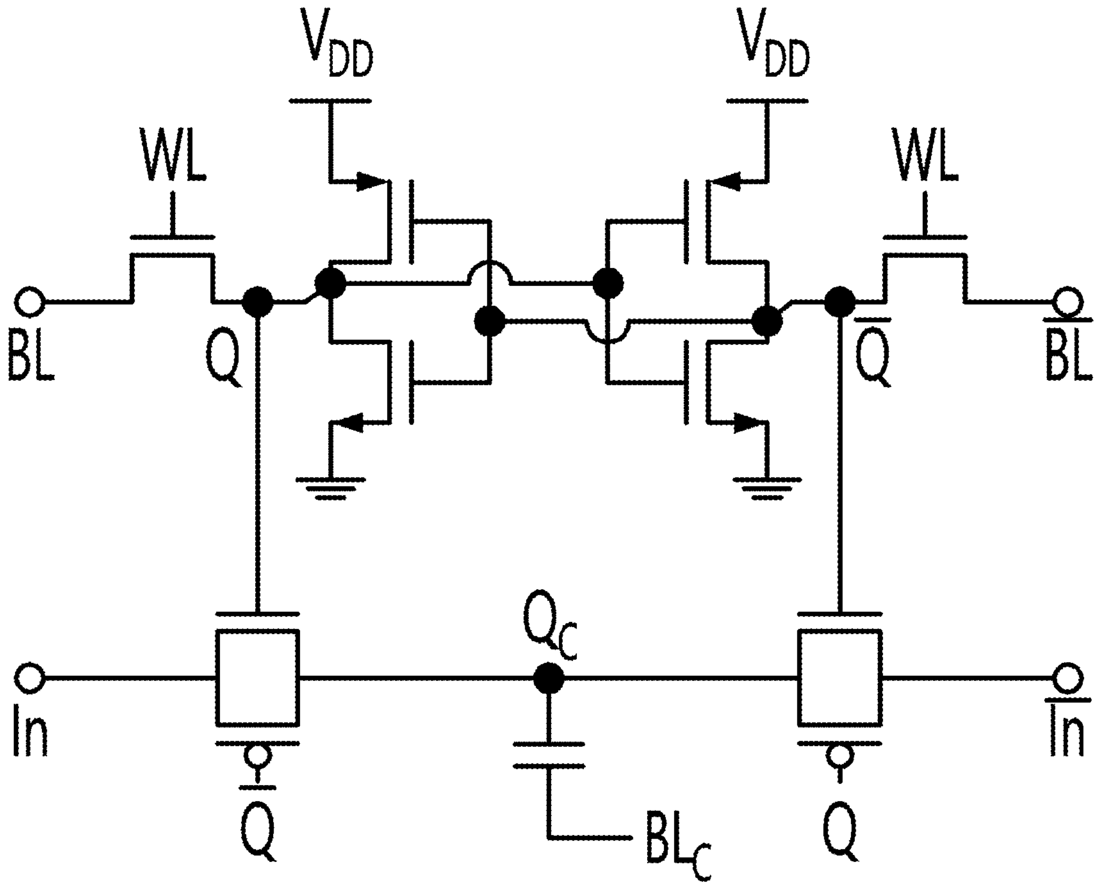

Hereinafter, embodiments of the present disclosure will be described in detail with reference to the attached drawings such that those skilled in the art to which the present disclosure belongs may easily practice the present disclosure. However, the present disclosure may be implemented in various different forms and is not limited to the embodiments described herein. In addition, in order to clearly describe the present disclosure in the drawings, parts that are not related to the description are omitted, and similar components are given similar reference numerals throughout the specification.

In the entire specification of the present disclosure, when a component is described to be "connected" to another component, this includes not only a case where the component is "directly connected" to another component but also a case where the component is "electrically connected" to another component with another element therebetween. In addition, when it is described that a portion "includes" a certain component, this means that the portion may further include another component without excluding another component unless otherwise stated.

In the present disclosure, a "portion" includes a unit realized by hardware, a unit realized by software, and a unit realized by using both. In addition, one unit may be realized by using two or more pieces of hardware, and two or more units may be realized by using one piece of hardware. Meanwhile, a "~ portion" is not limited to software or hardware, and a "~ portion" may be configured to be included in an addressable storage medium or may be configured to reproduce one or more processors. Therefore, in one example, "~ portion" refers to components, such as software components, object-oriented software components, class components, and task components, and includes processes, functions, properties, and procedures, subroutines, segments of program code, drivers, firmware, microcode, circuits, data, databases, data structures, tables, arrays, and variables. The functions provided within the components and "portions" may be combined into a smaller number of components and "portions" or may be further separated into additional components and "portions". Additionally, components and "portions" may be implemented to regenerate one or more central processing units (CPUs) included in a device or security multimedia card.

Figure 2:
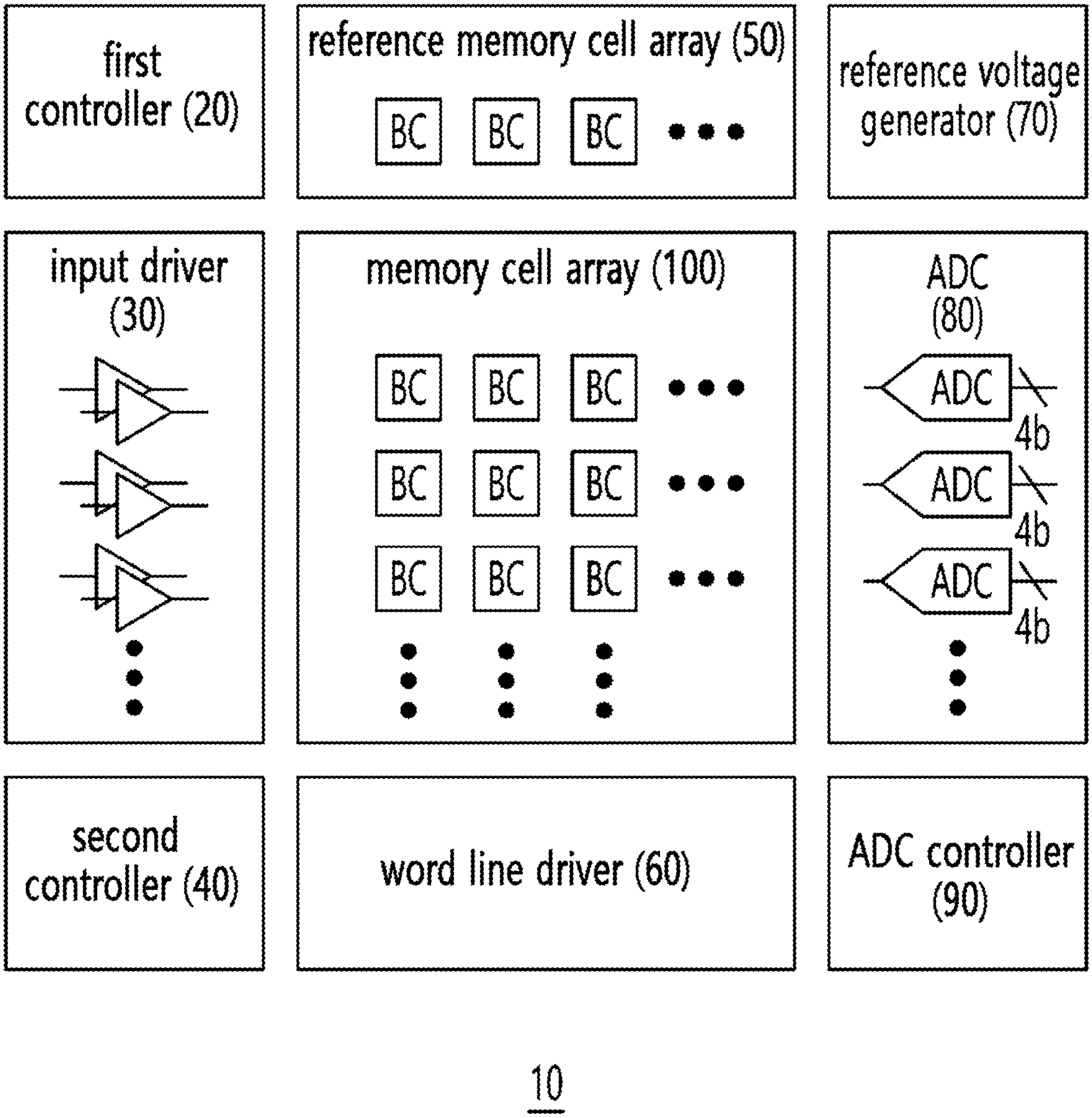
FIG. 2 illustrates a memory device according to an embodiment of the present disclosure.

FIG. 2 illustrates a memory device according to an embodiment of the present disclosure.

A memory device 10 includes a memory cell array 100 in which a plurality of memory cells performing in-memory computing are arranged in an array form, and various peripheral circuits. The peripheral circuits may include a first controller 20, an input driver 30, a second controller 40, a reference memory cell array 50, a word line driver 60, a reference voltage generator 70, an analog-to-digital converter (ADC) 80, and an ADC controller 90. The first controller 20 controls an operation of static random access memory (SRAM) included in each of memory cells, and the second controller 40 controls an operation of each of the memory cells. The input driver 30 transmits input data transmitted from the outside to the memory cell array 100. The reference memory cell array 50 includes a plurality of memory cells having the same structure as the memory cells included in the memory cell array 100. The word line driver 60 provides a word line signal to word lines connected to the memory cells. The reference voltage generator 70 generates various reference voltages required for an operation of the memory device 10. The ADC 80 converts an analog output of the memory cell array 100 into digital output, and the ADC controller 90 controls an operation of the ADC 80.

Figure 3:
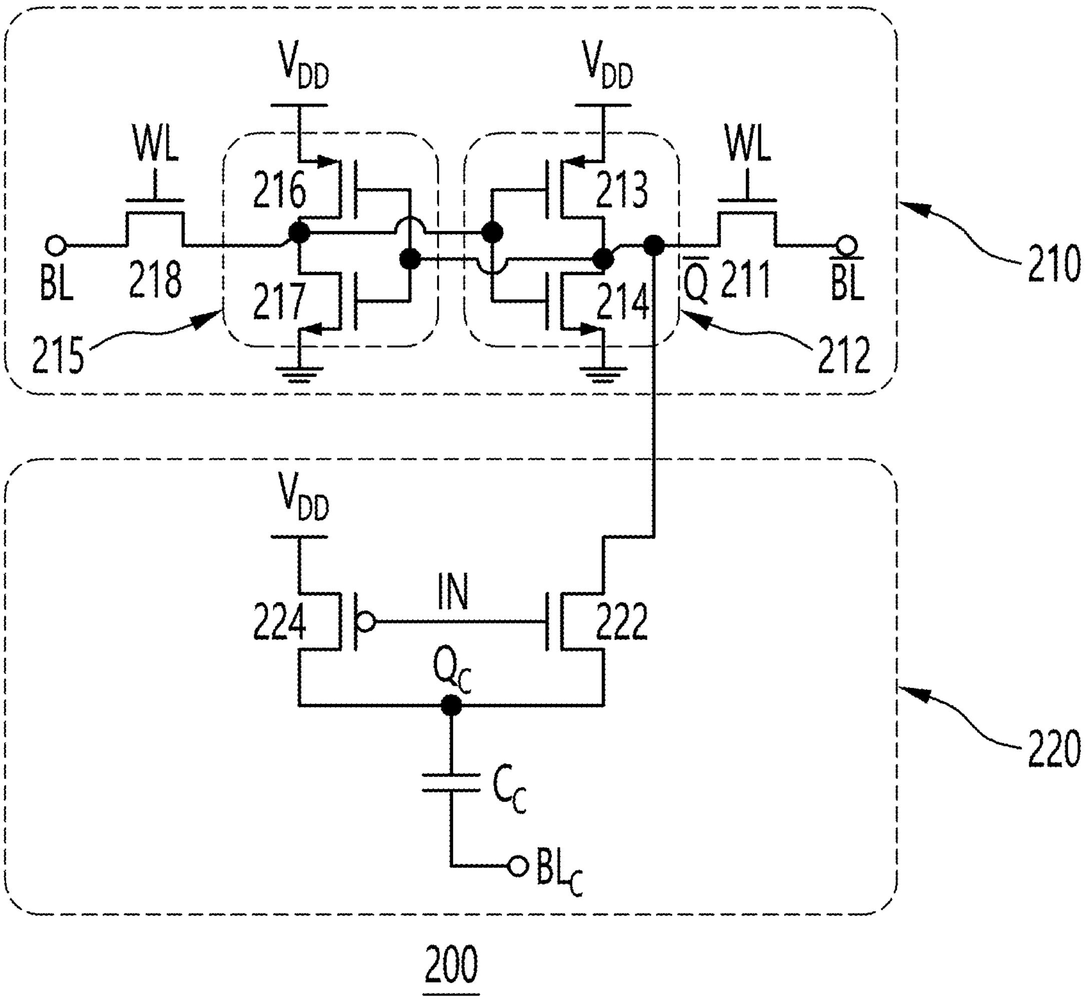
FIG. 3 illustrates a detailed configuration of a memory cell according to an embodiment of the present disclosure.
Figure 4:
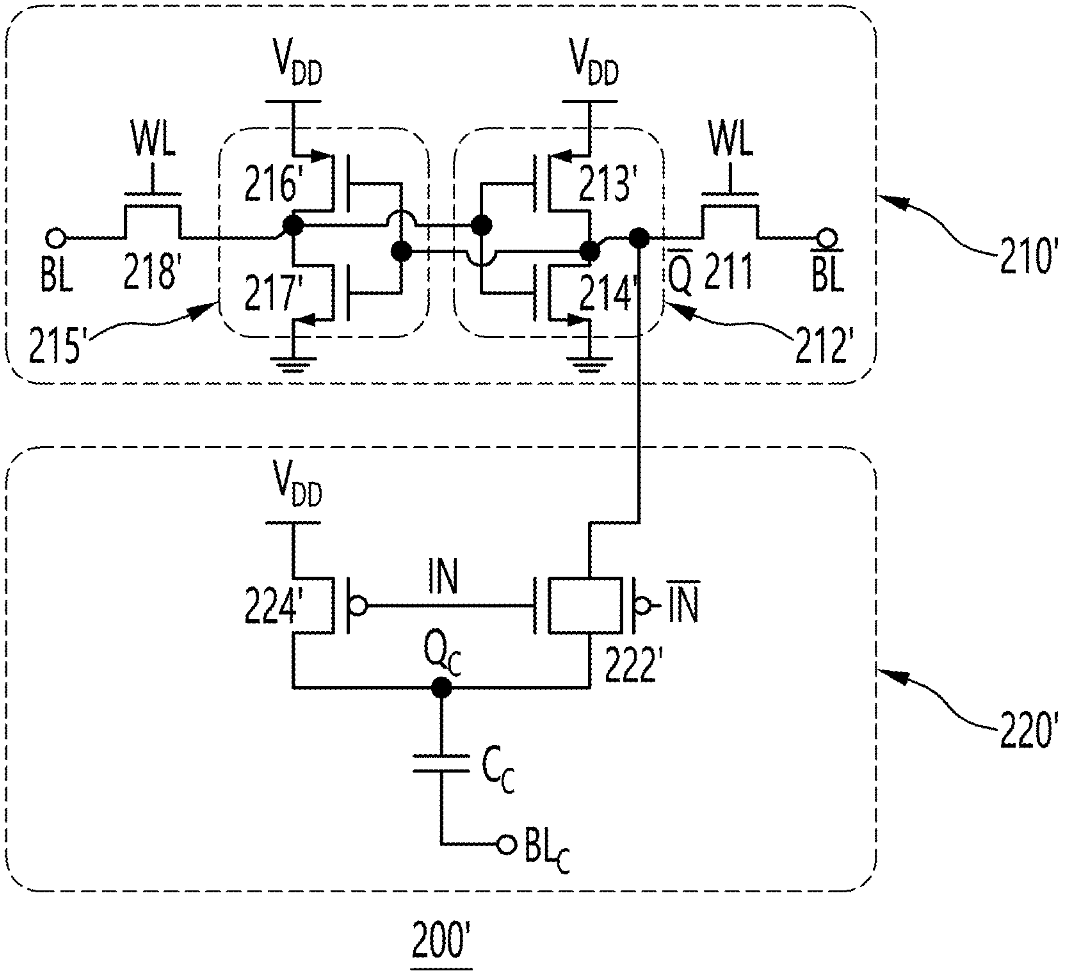
FIG. 4 illustrates a detailed configuration of a memory cell according to another embodiment of the present disclosure.

FIG. 3 illustrates a detailed configuration of a memory cell according to an embodiment of the present disclosure, FIG. 4 illustrates a detailed configuration of a memory cell according to another embodiment of the present disclosure, and FIG. 5 illustrates a truth table showing an operation of the memory cell according to the present disclosure.

First, referring to FIG. 3, a memory cell 200 of the present disclosure includes a storage unit 210 that stores storage data and an operation circuit 220.

The storage unit 210 has a 6T SRAM structure and includes a first switching element 211, a first inverter 212, a second inverter 215, and a second switching element 218.

One terminal of the first switching element 211 is connected to an inverse bit line/BL, and the other terminal of the first switching element 211 is connected to an input terminal/Q of the first inverter 212. One terminal of the second switching element 218 is connected to a bit line BL, and the other terminal of the second switching element 218 is connected to an input terminal of the second inverter 215. The first switching element 211 and the second switching element 218 are each have a gate to which a word line (WL) signal is applied.

The first inverter 212 includes a first PMOS transistor 213 and a first NMOS transistor 214, and the second inverter 215 includes a second PMOS transistor 216 and a second NMOS transistor 217. An output terminal of the first inverter 212 is connected to an input terminal of the second inverter 215, and the output terminal of the second inverter 215 is connected to the input terminal of the first inverter 212. Storage data is defined as an output value of the first inverter 212 or an input value of the second inverter 215. In addition, the storage data stored in the storage unit 210 is output through an output node/Q, and the output node/Q may be an input node of the first inverter 212 or a connection node between the first inverter 212 and the first switching element 211. In this case, the storage data may be weight data that constitutes an artificial intelligence model or a deep neural network model for which learning is completed.

The operation circuit 220 includes a first switching element 222, a second switching element 224, and a capacitor Cc. The first switching element 222 is switched by input data IN, one terminal of the first switching element 222 is connected to an output node of a storage unit 210, and the other terminal is connected to one terminal of the capacitor Cc. In addition, the second switching element 224 is switched by the input data IN, one terminal of the second switching element 224 is connected to a power supply voltage $V_{DD}$, and the other terminal is connected to one terminal of a capacitor Cc. The other terminals Qc of the first switching element 222 and the second switching element 224 are each connected to one terminal of the capacitor Cc. In this case, the first switching element 222 may be an NMOS transistor, and the second switching element 224 may be a PMOS transistor, and a gate of the first switching element 222 is connected to a gate of the second switching element 224, and the input data IN is input to the gates of the first switching element 222 and the second switching element 224.

One terminal of the capacitor Cc is commonly connected to the other terminal of the first switching element 222 and the other terminal of the second switching element 224, and the other terminal of the capacitor Cc is connected to an output terminal BLc.

A configuration of a memory cell 200' of FIG. 4 is almost the same as a configuration of the memory cell of FIG. 3, and a detailed configuration of the first switching element 222' of an operation circuit 220' is modified. That is, a transmission gate 222' is used as the first switching element 222' instead of an NMOS transistor. The transmission gate 222' operates in the same manner as the first switching element 222 of FIG. 3 in that the transmission gate 222' is turned on when the input data IN is applied and turned off when the input data IN is blocked. That is, when the input data IN is input to an NMOS transistor of the transmission gate and inverted input data/IN is input to a PMOS transistor of the transmission gate, and when high-level input data IN is transmitted, both the NMOS transistor and the PMOS transistor are turned on.

Referring to FIG. 5, the operation circuit 220 performs multiplication of input data and storage data, specifically, performs a logical NAND operation.

When the input data IN is low-level data, only the second switching element 224 is turned on, and accordingly, the power supply voltage VDD is charged to the capacitor Cc, regardless of a state of the storage data.

Next, when the input data IN is high-level data, only the first switching element 222 is turned on, and accordingly, the voltage charged to the capacitor Cc changes depending on a state of the storage data. That is, when the storage data of the storage unit 210 is low-level data and the output node/Q outputs high-level data, the capacitor Cc is charged with a high-level voltage. In contrast to this, when the storage data of the storage unit 210 is high-level data and the output node/Q outputs low-level data, the capacitor Cc is discharged to be in a low-level voltage. In addition, when the capacitor Cc may be precharged to a high-level voltage before the input data IN is applied. thereafter, the voltage charged to the capacitor Cc by capacitor coupling may be output to the output terminal BLc. In this way, it may be seen that the operation circuit 220 performs a NAND operation on the input data and the storage data.

In addition, this operation is performed in the same manner for the memory cell 200' of FIG. 4. Unlike the memory cell 200 of FIG. 3, the transmission gate is used instead of the first switching element 222', element sensitivity may be further improved.

Figure 6:
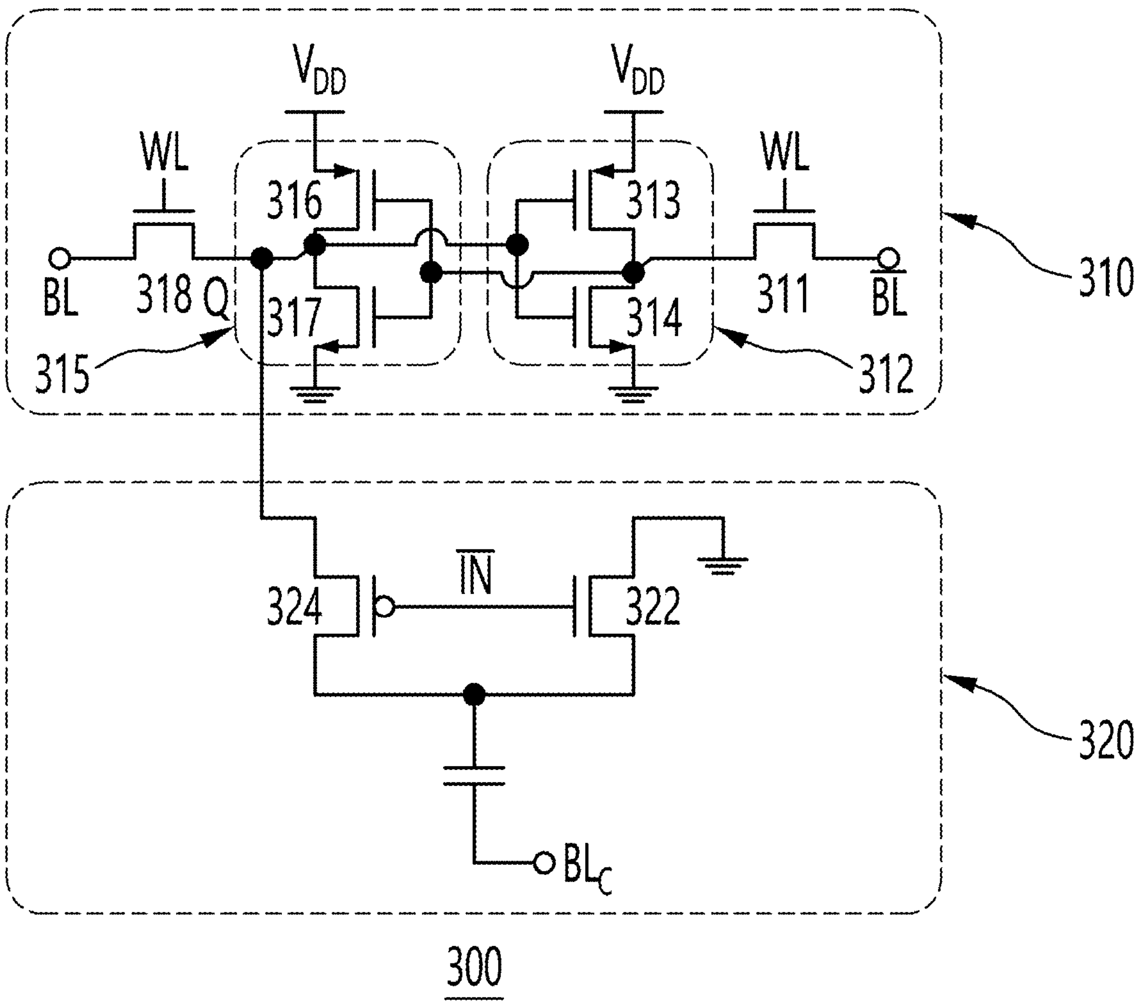
FIG. 6 illustrates a detailed configuration of a memory cell according to an embodiment of the present disclosure.
Figure 7:
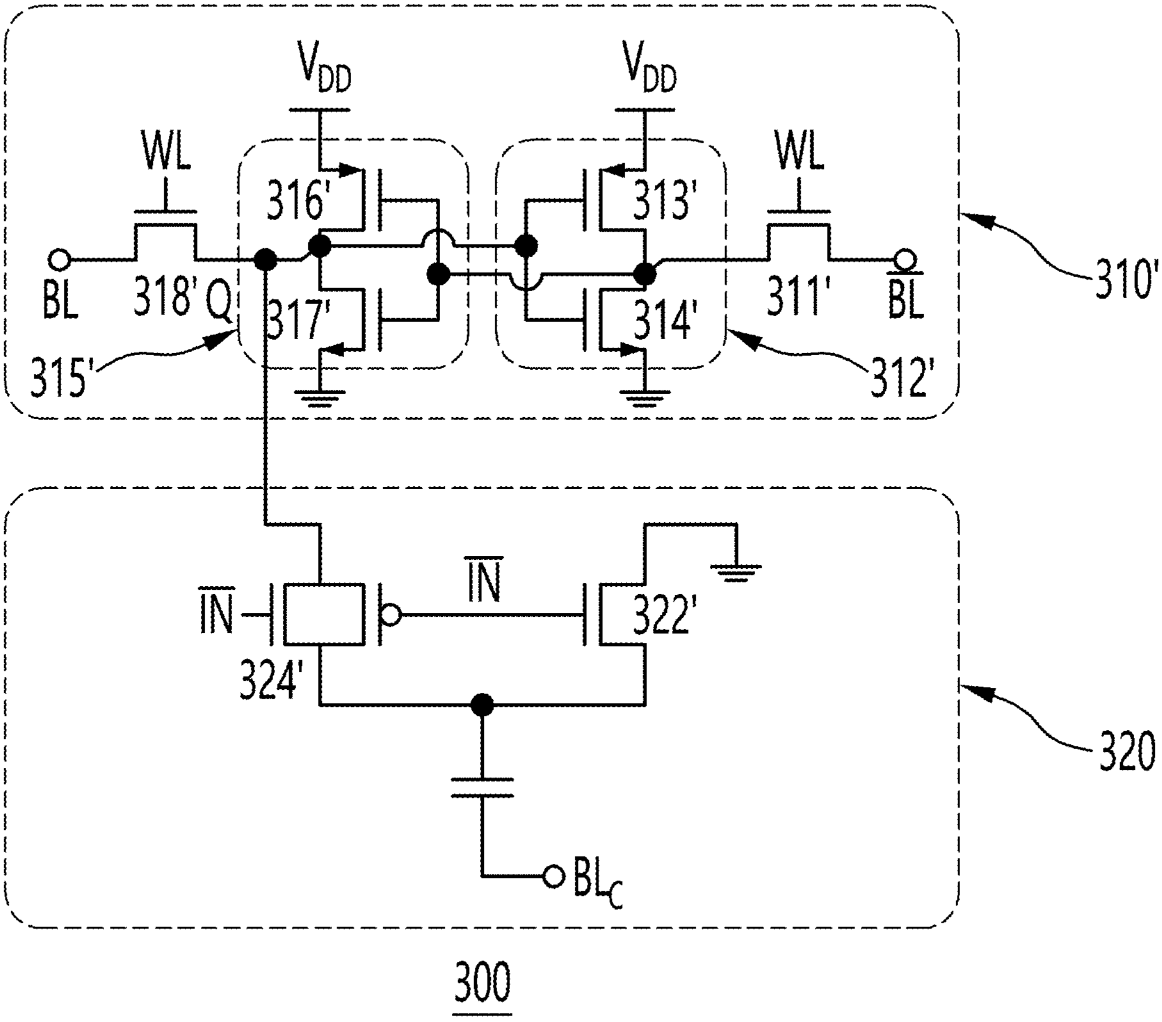
FIG. 7 illustrates a detailed configuration of a memory cell according to another embodiment of the present disclosure.

FIG. 6 illustrates a detailed configuration of a memory cell according to an embodiment of the present disclosure, FIG. 7 illustrates a detailed configuration of a memory cell according to another embodiment of the present disclosure, and FIG. 8 illustrates a truth table showing an operation of a memory cell according to the present disclosure.

Referring to FIG. 6, a memory cell 300 of the present disclosure includes a storage unit 310 that stores storage data and an operation circuit 320. A configuration of the storage unit 310 and the operation circuit 320 generally corresponds to the configuration of the storage unit 210 and the operation circuit 220 of FIG. 3.

That is, the storage unit 310 has a 6T SRAM structure and includes a first switching element 311, a first inverter 312, a second inverter 315, and a second switching element 318. The first inverter 312 includes a first PMOS transistor 313 and a first NMOS transistor 314, and the second inverter 315 includes a second PMOS transistor 316 and a second NMOS transistor 317. The storage data is defined as an output value of the first inverter 312 or an input value of the second inverter 315. In addition, the storage data stored in the storage unit 310 is output through an output node Q, and the output node Q may be an input node of the second inverter 315 or a connection node between the second inverter 315 and the second switching element 318. In this way, a configuration of the output node Q of the storage unit 310 is different from the output node Q of the storage unit 210 of FIG. 3. The storage data stored in the storage unit 310 is transmitted to the operation circuit 320 through the output node Q of the storage unit 310.

The operation circuit 320 includes a first switching element 322, a second switching element 324, and a capacitor Cc. The first switching element 322 is switched by inverted input data/IN, one terminal of the first switching element 322 is connected to a ground GND, and the other terminal of the first switching element 322 is connected to one terminal of the capacitor Cc. In addition, the second switching element 324 is switched by the inverted input data/IN, one terminal of the first switching element 322 is connected to the output node Q of the storage unit 310, and the other terminal of the first switching element 322 is connected to one terminal of the capacitor Cc. In this case, the first switching element 322 may be an NMOS transistor, the second switching element 324 may be a PMOS transistor, gates of the first switching element 322 and the second switching element 324 are connected to each other, and the inverted input data/IN is input to the gates.

One terminal of the capacitor Cc is commonly connected to the other terminal of the first switching element 322 and the other terminal of the second switching element 324, and the other terminal of the capacitor Cc is connected to an output terminal BLc.

A configuration of the memory cell 300' of FIG. 7 is almost the same as a configuration of the memory cell 300 of FIG. 6, and a specific configuration of a second switching element 324' of the operation circuit 320' is modified. That is, a transmission gate 324' is used as the second switching element 324 instead of a PMOS transistor. In addition, the inverted input data/IN is applied to gates of a first switching element 322' and the second switching element 324'. The second switching element 324' is configured such that when the input data IN is input to an NMOS transistor of the transmission gate and the inverted input data/IN is input to a PMOS transistor of the transmission gate, and when high-level input data IN is transmitted, both the NMOS transistor and the PMOS transistor are turned on.

Referring to FIG. 8, the operation circuit 320 performs multiplication of input data and storage data, specifically, a logical AND operation.

When the input data IN is low-level data, the inverted input data/IN becomes high-level data, and accordingly, only the first switching element 322 is turned on, and the capacitor Cc is discharged through ground regardless of a state of the storage data.

Next, when the input data IN is high-level data, the inverted input data/IN becomes low-level data, and accordingly, only the second switching element 324 is turned on, and the voltage charged to the capacitor Cc changes depending on the state of the storage data. That is, when the output node Q of the storage unit 310 outputs high-level data, the capacitor Cc is charged with a high-level voltage. In contrast to this, when the output node Q of the storage unit 310 outputs low-level data, the capacitor Cc is discharged to be in a low-level voltage. In addition, when the capacitor Cc may be precharged to a high-level voltage before the input data IN is applied. Thereafter, the voltage charged to the capacitor Cc by capacitor coupling may be output to the output terminal BLc.

In addition, this operation is performed in the same manner for the memory cell 300' of FIG. 7. Unlike the memory cell 300 of FIG. 6, the transmission gate is used as the second switching element 324, element sensitivity may be further improved.

In this way, it may be seen that the operation circuit 320 performs an AND operation on input data and storage data.

Figure 9:
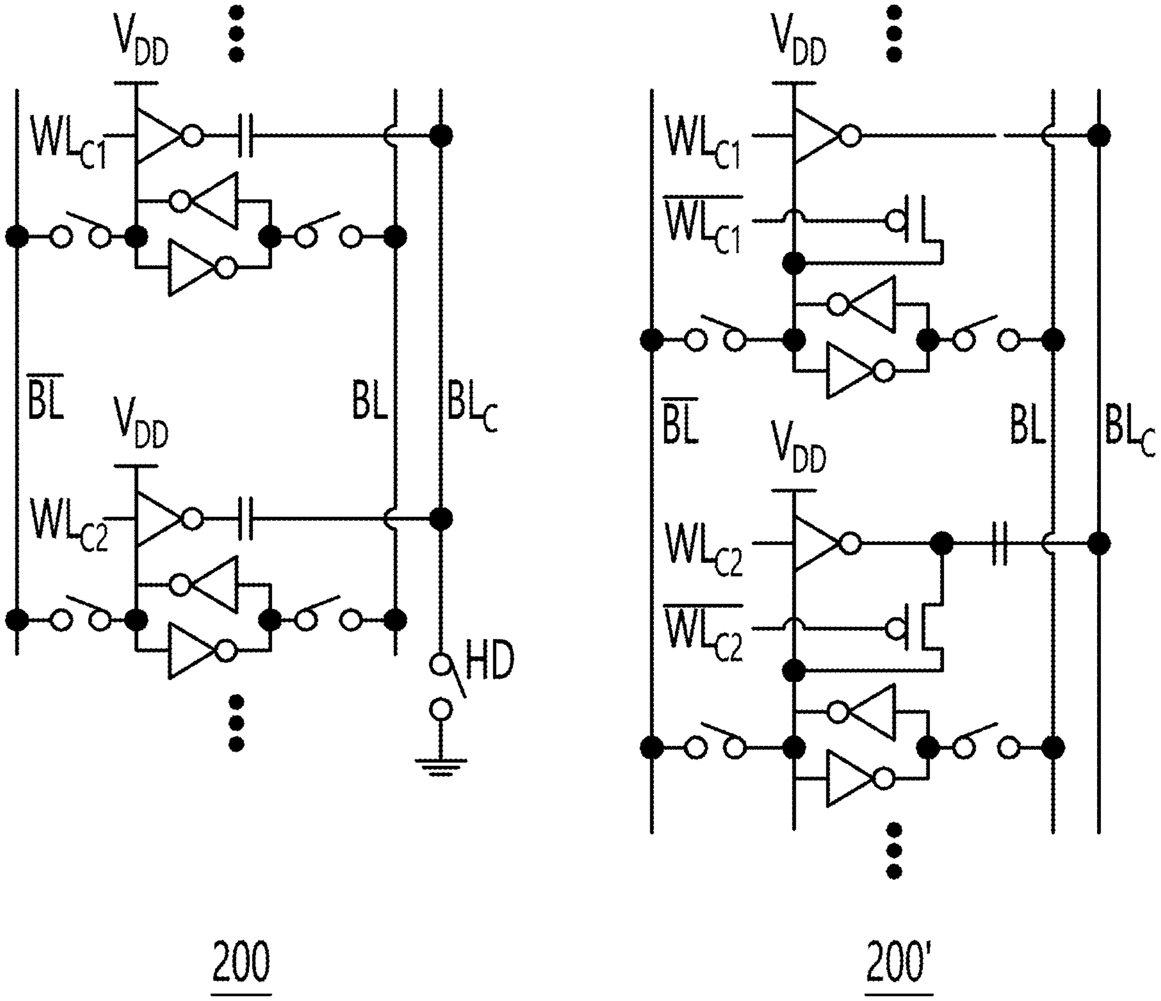
FIG. 9 illustrates a case where a plurality of memory cells according to an embodiment of the present disclosure are arranged.

FIG. 9 illustrates a case where a plurality of memory cells are arranged according to an embodiment of the present disclosure.

The first switching element and the second switching element included in the operation circuit 220 of the memory cell 200 are illustrated as corresponding inverters.

Also, the transmission gate and the second switching element included in the operation circuit 220' of the memory cell 200' are illustrated as corresponding inverters and additional PMOS transistors.

In the memory cell 200, when external data is input, there is a possibility that values stored in surrounding memory cells may change, and accordingly, a hold switch HD may be added to an output terminal BLc to prevent the change of the values. In addition, while the memory cell 200 receives an input signal, the hold switch HD is turned on to fix a voltage value of the output terminal BLc. In addition, when reception of the input signal is completed, the hold switch HD is turned off, and inverted charges of the value stored in a node Qc is coupled to the output terminal BLc to transmit the value, and thereby, an accumulation operation may be performed.

In contrast to this, as a switching element connected to a power supply is added to the memory cell 300, a state of the memory cell 300 may be stably maintained without adding the hold switch HD.

Figure 10:
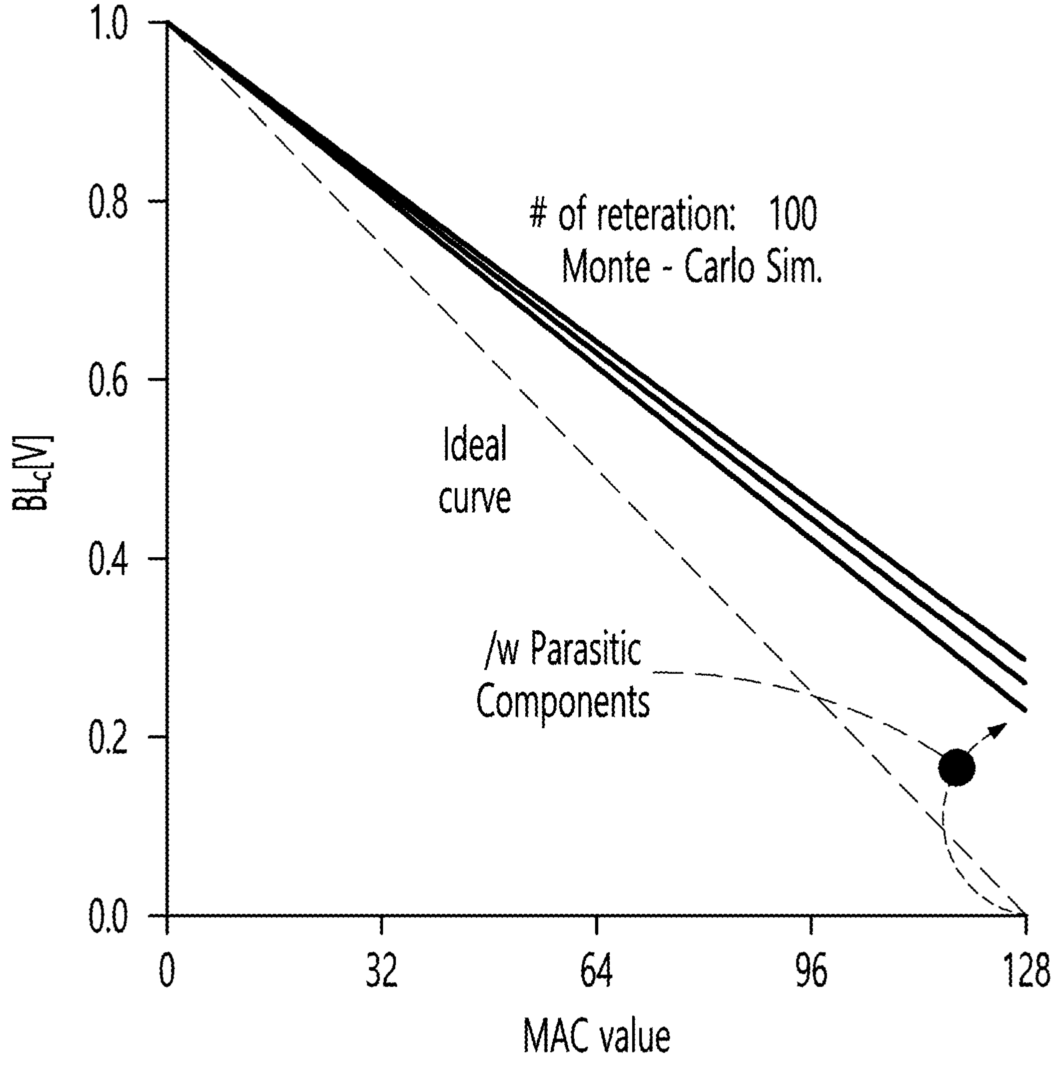
FIG. 10 illustrates an operation output result of a memory cell according to an embodiment of the present disclosure.

FIG. 10 illustrates an operation output result of another memory cell according to an embodiment of the present disclosure.

FIG. 10 illustrates simulation results of internal signals which change according to input data and storage data in a column connected to 128 memory cells, each having a 9T1C structure described above with reference to FIG. 4. Values of the output terminal BLc are shown as multiply and accumulate (MAC) voltages obtained by multiplying the input data by the storage data for each cell and accumulating the data, as shown in the graph, and it may be seen that capacitor-based operations according to the present disclosure have high linearity compared to the conventional resistance-based operations. The Monte Carlo simulation results of the present disclosure show a waveform that decreases from an ideal output value by a ratio between of a coupling capacitor and parasitic components due to parasitic components, but it may be seen that a wide output range and high linearity are still maintained.

The above description of the present disclosure is intended to be illustrative, and those skilled in the art will appreciate that the present disclosure may be readily modified in other specific forms without changing the technical idea or essential characteristics of the present disclosure. Therefore, the embodiments described above should be understood as illustrative in all respects and not limiting. For example, each component described in a single type may be implemented in a distributed manner, and likewise, components described in a distributed manner may be implemented in a combined form.

The scope of the present application is indicated by the claims described below rather than the detailed description above, and all changes or modified forms derived from the meaning, scope of the claims, and their equivalent concepts should be interpreted as being included in the scope of the present application.

What is claimed is:

1. A memory device comprising:

a plurality of memory cells performing in-memory computing, wherein each of the plurality of memory cells includes a storage unit storing data, and an operation circuit that includes a capacitor and controls a voltage charged to the capacitor according to input data and storage data stored in the storage unit, wherein the operation circuit includes:

a first switching element which is switched according to the input data and has a first terminal thereof connected to a first output node of the storage unit and transmits inverted storage data to a second terminal of the first switching element;

a second switching element which is switched according to the input data and has a first terminal thereof connected to a power supply voltage and transmits the power supply voltage to a second terminal of the second switching element; and a capacitor having a first terminal thereof connected to the second terminal of the first switching element and to the second terminal of the second switching element, wherein the input data is commonly applied to a gate of the first switching element and a gate of the second switching element, and wherein the operation circuit outputs a NAND operation result of the input data and the storage data.

2. The memory device of claim 1, wherein the storage unit includes SRAM having a 6T structure and includes a first inverter and a second inverter, outputs inverted storage data through a first output node to which an output terminal of the second inverter and an input terminal of the first inverter are connected, or outputs the storage data through a second output node to which an output terminal of the first inverter and an input terminal of the second inverter are connected.

3. The memory device of claim 1, wherein the first switching element is one of an NMOS transistor and a transmission gate, and the second switching element is a PMOS transistor.

4. The memory device of claim 1, wherein, when the input data is logic low data, the second switching element is turned on, and the power supply voltage is charged to the capacitor regardless of the storage data;

when the input data is logic high data, the first switching element is turned on, and the voltage charged to the capacitor changes depending on the storage data;

when the storage data is the logic low data, the first output node outputs the logic high data, and a logic high voltage is charged to the capacitor; and when the storage data is the logic high data, the first output node outputs the logic low data, and the capacitor is discharged to be in a logic low voltage.

5. A memory device comprising:

a plurality of memory cells performing in-memory computing, wherein each of the plurality of memory cells includes a storage unit storing data, and an operation circuit that includes a capacitor and controls a voltage charged to the capacitor according to input data and storage data stored in the storage unit, wherein the operation circuit includes:

a first switching element which is switched according to inverted input data and has a first terminal of the first switching element that is grounded;

a second switching element which is switched according to the inverted input data and has a first terminal of the second switching element connected to a second output node of the storage unit and transmits the storage data to a second terminal of the second switching element; and a capacitor having a first terminal thereof connected to a second terminal of the first switching element and to the second terminal of the second switching element, wherein the inverted input data is commonly applied to a gate of the first switching element and a gate of the second switching element, and wherein the operation circuit outputs an AND operation result of the input data and the storage data.

6. The memory device of claim 5, wherein the first switching element is an NMOS transistor, and the second switching element is one of a PMOS transistor and a transmission gate.

7. The memory device of claim 5, wherein, when the input data is logic low data, the first switching element is turned on and the capacitor is discharged through a ground regardless of the storage data;

when the input data is logic high data, the second switching element is turned on and a voltage charged to the capacitor changes according to the storage data;

when the storage data is the logic low data, the second output node outputs the logic low data to discharge the capacitor to be in a logic low voltage; and when the storage data is the logic high data, the second output node outputs the logic high data to charge the capacitor to be in a logic high voltage.

* * * * *